United States Patent [19]

Martin

[11] Patent Number: 4,675,617
[45] Date of Patent: Jun. 23, 1987

[54] STABLE VOLTAGE CONTROLLED OSCILLATOR

[76] Inventor: Kenneth W. Martin, 3533 Greenfield Ave., Los Angeles, Calif. 90034

[21] Appl. No.: 825,397

[22] Filed: Feb. 3, 1986

[51] Int. Cl.$^4$ .............................................. H03L 7/00
[52] U.S. Cl. ..................................... 331/1 A; 331/47; 331/144; 331/DIG. 3
[58] Field of Search ....................... 331/1 A, 2, 25, 46, 331/47, 55, 111, 113 R, 143, 144, 176, DIG. 3

[56] References Cited

U.S. PATENT DOCUMENTS 4,083,020 4/1978 Goldberg ................. 331/DIG. 3 X
4,567,448 1/1986 Ikeda .................................. 331/2 X Primary Examiner—Eugene R. LaRoche
Assistant Examiner—Robert J. Pascal
Attorney, Agent, or Firm—Poms, Smith, Lande & Rose

[57] ABSTRACT

A voltage controlled oscillator (VCO) is stabilized against variations in output frequency resulting from changes in temperature or the power supply voltage by trimming the voltage controlled oscillator from a second master VCO which is connected into a phase lock loop. Each of the two voltage controlled oscillators has an output frequency which is a function of two inputs. The signal input to one control input of each of the VCO's is the output of the low pass filter in the phase lock loop. The VCO's may both be implemented by cross-coupled NOR gates with grounded capacitor inputs.

11 Claims, 6 Drawing Figures

STABLE VOLTAGE CONTROLLED OSCILLATOR

FIELD OF THE INVENTION

This invention relates to stabilized voltage controlled oscillator systems, and to the circuits included in such systems.

BACKGROUND OF THE INVENTION

Voltage controlled oscillators should have a stable operating frequency as long as the input voltage does not change, but often shift frequency with changes in the power supply voltage or the ambient temperature.

Various circuits have been proposed to avoid this problem, and one prior arrangement utilizing a switched capacitor relaxation oscillator is disclosed in my article entitled "A Voltage Controlled Switched Capacitor Relaxation Oscillator", IEEE Journal of Solid State Circuits, Vol. SC-16 No. 4, August 1981. However, such circuits are undesirable for many applications in view of the excess phase jitter. Other articles which relate to the general subject matter of this invention include the following:
1. Charge-Pump Phase-Lock Loops, by Floyd M. Gardner, IEEE Transactions on Communications, Vol. COM-28, No. 11, Nov. 1980, pages 1849–1858.
2. Fully Integrated Analog Filters Using BipolarJ-FET Technology, by Khen-Sang Tan and Paul R. Gray, IEEE Journal of Solid State Circuits, Vol. SC-13, No. 6, Dec. 1978, pages 814–821.
3. A CMOS Low-Distortion Switched Capacitor Oscillator with Instantaneous Start-up, by Roger P. Colbeck, IEEE Journal of Solid-State Circuits, Vol. SC-19, No. 6, Dec. 1984, pages 996–998.
4. NMOS Phase Lock Loop, by H. Khorramabadi, Memorandum No. UCB/ERL M77/67, 8 Nov. 1977, Electronics Research Laboratory, College of Engineering, University of California Berkeley, pages 1–30.
5. Design of Integrated Analog CMOS Circuits - A Multichannel Telemetry Transmitter, by Wolfgang Stinhagen and Walter L. Engle, IEEE Journal of Solid State Circuits, Vol. SC-13, No. 6, Dec. 1978, pages 799–805.
6. High Frequency CMOS Continuous - Time Filters, by Haideh Khorramabadi and Paul R. Gray, IEEE Journal of Solid State Circuits, Vol. SC-19, Dec. 1984, pages 939–948.
7. An MOS Phase Locked Loop for Telecommunications Applications, by Yusuf A. Hague and Vikram A. Saletore, IEEE CH 1742-6/81, pages 303–307.
8. Switched-Capacitor Circuit Design, by Roubik Gregorian, Kenneth W. Martin and Gabor C. Temes, Proceedings of the IEEE, Vol. 71, No. 8, August 1983, pages 941–966.

Accordingly, a principal object of the present invention is to provide a voltage controlled oscillator which is stabilized against frequency shifts resulting, for example, from power supply or temperature variations.

SUMMARY OF THE INVENTION

In accordance with an important aspect of the present invention, a master voltage controlled oscillator (VCO) and a slave voltage controlled oscillator are provided; the master VCO is connected into a phase lock loop; and the free running frequency of the slave VCO is trimmed from the control input to the VCO of the master VCO.

In accordance with another aspect of the invention a pair of voltage controlled oscillators, or VCO's, each have an output which is the product of, or is a function of two inputs. Thus, one input may control the magnitude of charging current for a multivibrator type circuit forming the VCO and the other input may control the trip point of the active components of the multivibrator type circuit. Using two similar or substantially identical VCO's and connecting one in a phase lock loop, the stable control output from the charge pump of the phase lock loop may be used to provide one of the inputs, for example, to control the trip point of the free running VCO. This avoids fluctuations with power supply variations, and other variations, such as temperature variations, for example.

In accordance with a further aspect of the invention each of the voltage controlled oscillators may be made up of a pair of cross-coupled NOR gates, with one input of each NOR gate coupled to the output of the other NOR gate. A capacitor is connected to the other input of each NOR gate, with a current source charging up each capacitor, and transistors, controlled from the output of the other NOR gate, connected to alternately discharge each capacitor and to then permit each capacitor to charge to the trip point of the NOR gate.

Other objects, features and advantages of the invention will become apparent from a consideration of the following detailed description and from the accompanying drawings.

DETAILED DESCRIPTION

Figure 1:
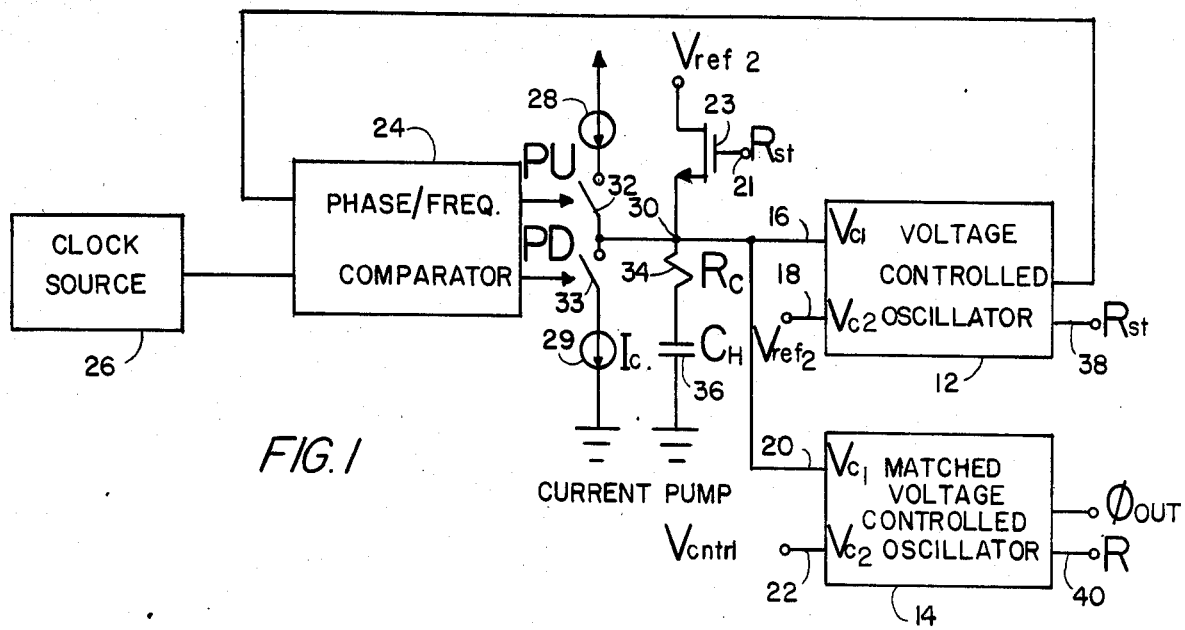
FIG. 1 is a block diagram of a system illustrating the principles of the present invention in which a phase lock loop is employed to trim a matched voltage controlled oscillator.

Referring more particularly to the drawings, FIG. 1 shows two voltage controlled oscillators 12 and 14 each of which has an output frequency which is determined by the product of, or as a function of, two inputs. The two inputs, with respect to the voltage controlled oscillator (VCO) 12, are 16 and 18. For the VCO 14 the two control inputs are 20 and 22. The voltage controlled oscillator 12 is employed in a phase lock loop which includes the phase/frequency comparator 24, which has as one input the clock source 26, and as its other input the output from the VCO 12. Prior to start-up, the reference voltage Vref-2 is connected through switch 23 to node 30, to initiate oscillation in the VCO 12 at approximately the correct frequency. The reference voltage Vref-2 is also supplied to the second input 18 to place the voltage controlled oscillator approximately in the center of the desired frequency range. When the system is turned on, the switch 23 is shut off, and the switches 32 and 33 are operated under the control of the phase/frequency comparator 24 so that the voltage controlled oscillator 12 will lock onto the frequency of the clock source 26. As discussed in greater detail in the Gardner "Charge-Pump ..." article cited above, the switches 32 and 33 are operated in accordance with a comparison of the pulses from clock source and VCO 12 to shift the voltage at node 30 up or down by supplying current from source 28 or withdrawing current by "drain" 29. Incidentally, immediately after power is applied to the chip on which the circuit of FIG. 1 is implemented, the Rst inputs, including input 21 to transistor 23 are pulsed or strobed high, or to about +5 volts, so that the reference voltage Vref-2 is applied to node 30 to start oscillation close to the final free running frequency.

It may be noted that the control voltage applied to the input 16 of VCO 12 and to control input 20 of VCO 14 is the output from the low pass filter made up of the resistor 34 and the capacitor 36 at node 30. The two VCO's 12 and 14 are matched, and may also, for example, be mounted on the same chip, so that the output frequency of the second VCO 14 will be closely matched to the frequency of the first VCO 12, when the second control input 22 of the second VCO 14 is at the same reference voltage. It is not necessary that the free running frequency of the second VCO be the same as that of the first VCO. Rather, by using carefully matched current sources, any free running frequency can be obtained without off-chip components and without additional trimming. Also, the free running frequency of the VCO 14 will be very stable with time and temperature.

In order to minimize jitter, a good quality current pump should be employed to drive the holding capacitor 36 of the low pass filter. In addition, a high quality phase/frequency comparator 24 should be employed. For example, it may be identical to that employed in the RCA CD 4046 phase lock loop. This type of phase comparator does not exhibit false lock frequencies, has a very wide lock range, and also has very little jitter when locked onto stable square wave inputs, such as those provided by the clock source 26. The resistor 34 is required for good stability when using charge pumps to drive a low pass filter. As noted above when the system is being placed in operation, the Rst inputs are pulsed or strobed high, after power has been applied to the chips containing the oscillators, to guarantee oscillation and to start the oscillators operating close to their final free running frequencies.

Figure 2:
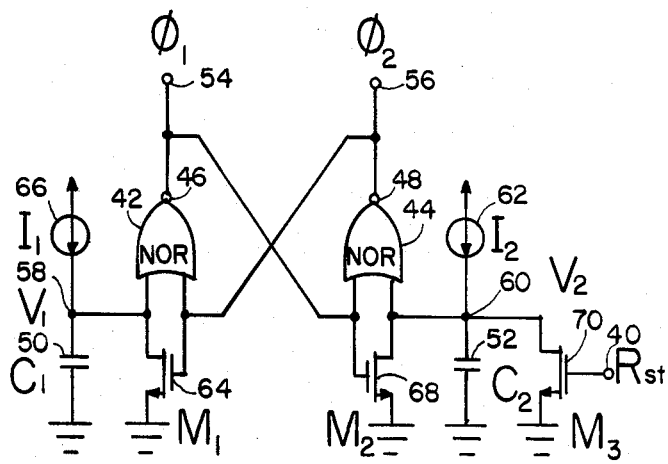
FIG. 2 is a simplified showing of a symmetrical oscillator which may be employed in the implementation of the voltage controlled oscillators of FIG. 1.

Referring now to FIG. 2, a relaxation oscillator is disclosed which may be employed in the implementation of the VCO's 12 and 14 of FIG. 1. More particularly, the oscillator of FIG. 2 is based on cross-coupled NOR gates 42 and 44. A NOR gate is an OR gate, with inversion of polarity at its output, as indiated by the small circles 46 and 48. An OR gate normally has a "one" output when either or both of the two inputs are "1's." In the circuitry of the illustrative embodiments of the invention, metal oxide semi-conductor field effect transistors (MOSFETS) are employed, and the voltage switching is between about plus five volts, representing a "1" and about ground potential, representing "0".

The oscillator circuit of FIG. 2 only requires grounded capacitors 50 and 52, and thus the large parasitic bottom plates of integrated capacitors will have no effect on the oscillation frequency. By carefully matching components, the oscillator of FIG. 2 can be guaranteed to have very close to a fifty percent duty cycle. Also, its two outputs at points 54 and 56 are non-overlapping complementary signals.

In order to understand the operation of the oscillator of FIG. 2, assume that initially Rst at terminal 40 is a "1". The only stable state is for both V1 at point 58 and V2 at point 60 to be low, output 65 to be a "0" and output at point 56 to be a "1". After Rst goes low, at input terminal 40, transistor 70 is turned off, and the current source 62, also designated $I_2$ will slowly charge capacitor 52. Once $V_2$ at point 60 reaches the threshold voltage of NOR gate 44, then the voltage at point 56 representing phase-2 will go low, shutting off transistor M1, also designated by reference numeral 64, and letting current source 66, also designated $I_1$ slowly charge capacitor C1. At the same time, the output (phase-1) at terminal 54 goes high, turning transistor M2 (also designated by reference 68) on and quickly discharging capacitor 52. When V1 at point 58 reaches the threshold voltage of NOR gate 42, phase-1 at terminal 54 goes to a "0," phase-2 at point 56 goes to a "1," capacitor 52 starts to charge, and capacitor 50 is quickly discharged by transistor 64. This operation is repeated once every period. The start-up transistor M3 (also designated by reference 70) is required to guarantee that the stable state at the outputs of the two NOR gates 42 and 44 and at terminals 54 and 56, both being a "1" is not encountered.

Incidentally, returning to basics, it may be noted that the transistors such as transistors 64, 68 and 70, which have their source electrodes grounded, are turned off when the gate electrodes are close to ground potential or are "low". On the other hand, when the gate electrodes go "high" or up to about five volts or higher, the transistors are turned on, and there is a very low resistance path between the source and the drain electrodes.

Figure 3:
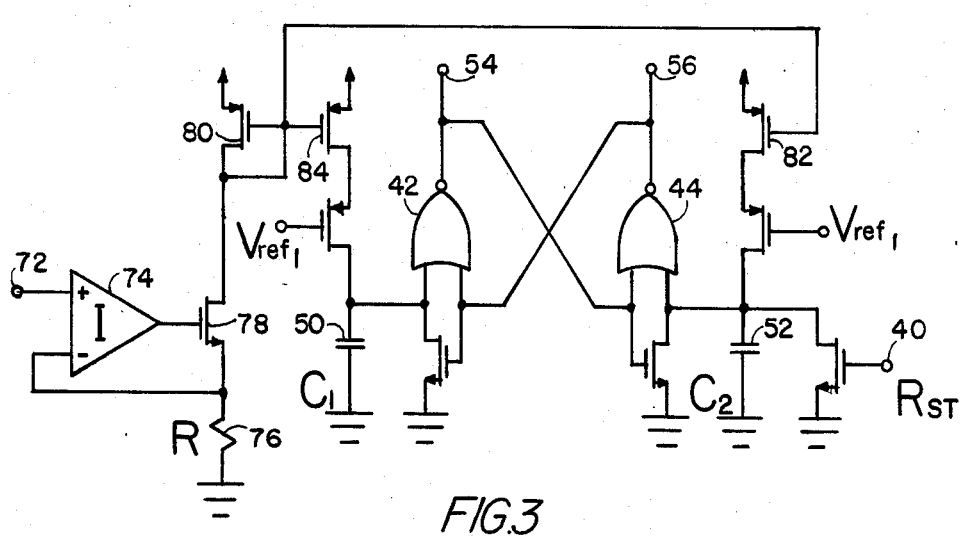
FIG. 3 is a more detailed showing of one possible implementation of the circuit of FIG. 2.

Now, referring to FIG. 3, in order to realize a voltage controlled oscillator, or VCO, the current sources $I_1$ and $I_2$ indicated by reference numerals 62 and 66 in FIG. 2, can be made proportional to an input voltage applied to terminal 72 of FIG. 3. A voltage-to-current converter is realized using the operational amplifier or opamp 74 and resistor 76. This current is then accurately mirrored using a cascode current mirror including transistors 78, 80, 82 and 84. Note that, with the physical construction of transistors 80, 82 and 84 being identical, and with the gate electrodes of these three transistors being coupled together, the two transistors are operated under identical conditions, and the currents flowing through transistors 82 and 84 will therefore be identical. It may also be noted that the currents through transistors 82 and 84 correspond to the two currents shown schematically in FIG. 2 by the reference numerals 62 and 66.

One slight drawback for the VCO shown in FIG. 3, which is also true of most other relaxation type VCOs, is that its oscillation frequency may be strongly dependent on the power supply voltage. This is because the threshold voltage of the NOR gates may be proportional to the power supply voltage. This dependence can be eliminated if the size of the resistor is also proportional to the power supply. This may be approximated if the resistor is realized by the drain-source resistance of a transistor in the triode region, with its gate connected to $V_{DD}$, the power supply.

Figure 4:
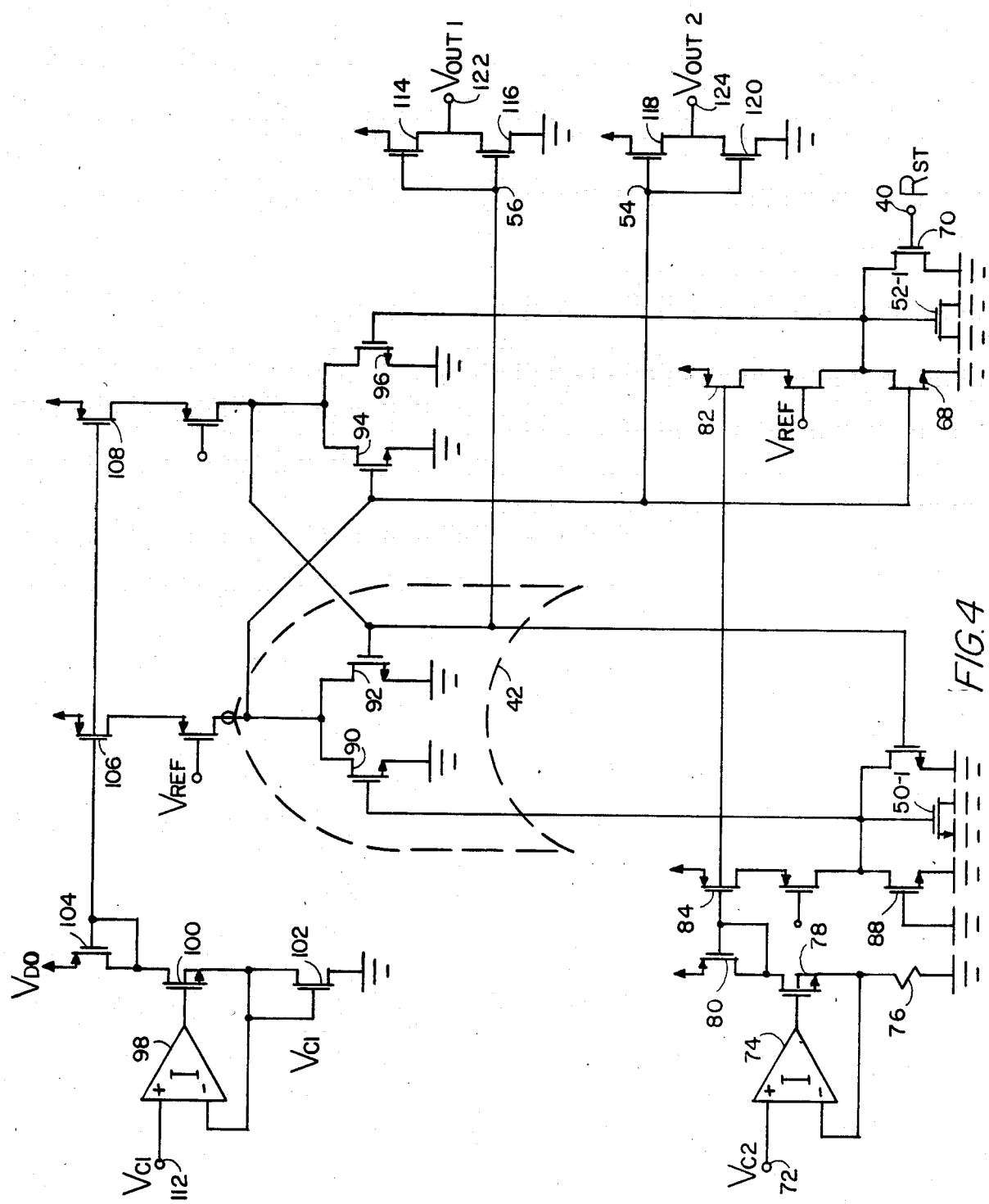
FIG. 4 is a still more detailed showing of one implementation of the circuit of FIGS. 2 and 3, including related collateral circuits for increasing stability.

Alternatively, the resistor can be realized by polysilicon, and the NOR gates can be modified so that their threshold voltages are independent of $V_{DD}$. One approach for accomplishing this last technique is shown in FIG. 4. Incidentally, relative to FIG. 4, those circuit components which have been discussed above and which are the same in FIG. 4 carry the same reference numerals. Concerning one minor matter, the capacitors 50 and 52 are realized in FIG. 4 by using standard MOSFET circuit elements with the source and the drain grounded. These components are designated 50-1 and 52-1 in FIG. 4. It may also be noted that the transistor 88, which never conducts, has been added to match the input transistor 70 in order to keep the circuit entirely symmetrical.

The NOR gate 42, which is shown in dashed line form, is implemented by the two transistors 90 and 92. Similarly, the NOR gate 44 of FIGS. 2 and 3 is implemented by the two transistors 94 and 96 in FIG. 4.

The bias currents for the NOR gates are obtained from the voltage-to-current converter including the operational amplifier 98 and the transistors 100 and 102. Accurate cascode current mirrors are used so that the current as controlled by transistors 100, 102 and 104 is guaranteed to be equal in transistors 106 and 108.

Now, assuming that transistor 92 of the NOR gate 42 is off, then the current in transistor 90 will be equal to the current in transistor 106 when the gate voltage of transistor 90 is equal to the control voltage VCl applied to input terminal 112 of operational amplifier 98, and also present at the gate input to transistor 102. This voltage will be very close to the threshold voltage of the NOR gate 42. Accordingly, when the voltage across "capacitor" 50-1 builds up so that the voltage at the gate electrode of transistor 90 equals or exceeds this level, the NOR gate 42 will change state. The same mode of operation will be true for the second NOR gate made up of transistors 94 and 96. Thus, the threshold voltages of the oscillator will be determined by the control voltage VCl independent of the power supply voltage. If the resistor 76 is realized using polysilicon, then its value will also be very nearly power supply independent. The use of the cascode current mirrors is very effective in eliminating second order errors that might otherwise occur.

The output terminals from the voltage controlled oscillator of FIG. 4 appear at the far right hand side of FIG. 4 at reference 122 and 124. The inverter transistors 114, 116, 118, and 120 serve to isolate the VCO of FIG. 4 from "the outside world", and thus preserve the symmetry of the circuit.

Figure 5:
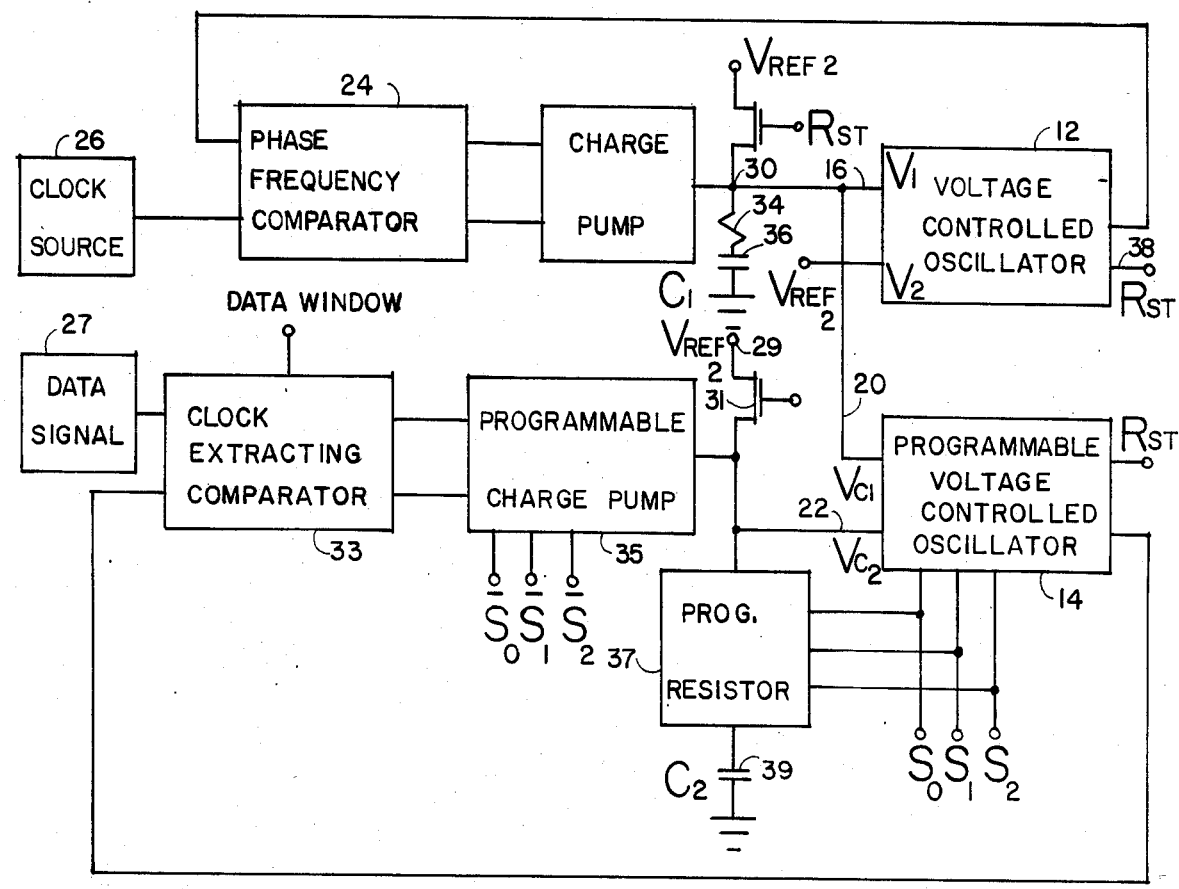
FIG. 5 is a system block diagram illustrating the principles of the present invention.

Referring now to FIG. 5, this is a fairly complete block diagram circuit of a phase lock loop suitable for clock recovery in a floppy disc controller environment. More particularly, the circuit includes a source of digital clock signals 26, and a source of data signals 27 which may for example be digital data coming from a floppy disc storage track. Naturally, this data will only arrive intermittently, and will be a series of ones and zeroes, unlike the continuous clock signal arriving from the source 26. Now, the voltage control oscillator 12 and the VCO 14 may be of the type shown in FIG. 4, and accordingly will be very stable. Also, as mentioned above, the input VCl to the slave VCO 14 is derived from node 30 and therefore the trip point of the NOR gates included in the VCO 14 are substantially independent of variations in temperature or of the voltage supply.

An important purpose of the VCO 14 is to provide a clock signal which is synchronized with the digital data signal from the source 27, which is the data being recovered from the floppy disc. Accordingly, during intervals between the arrival of data from the source 27, a second voltage reference signal is applied to input 22 to the VCO from terminal 29 through the transistor 31. The value of the second voltage reference applied to terminal 29 is approximately that which will cause the VCO 14 to oscillate at the normal frequency at which data arrives from the signal source 27. As soon as data starts arriving from the data signal source 27, however, the transistor 31 is shut off, and the VCO 14 comes into synchronism with the incoming data, as a result of the loop including the clock extracting comparator 33, the programable charge pump 35 and the programable resistor 37 which forms a low pass filter in combination with the capacitor 39. With this arrangement, the VCO 14 quickly synchronizes with the incoming data, and the clock signals for processing this incoming data are promptly available.

Figure 6:
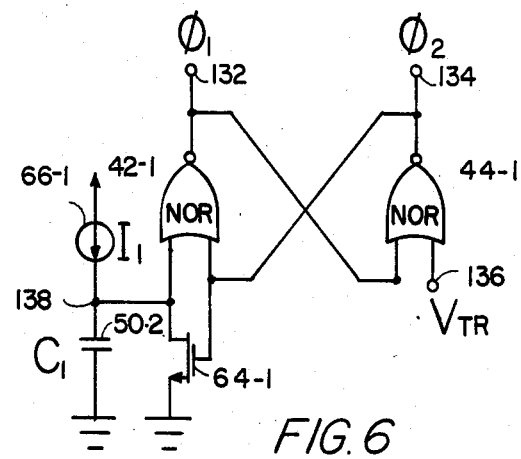
FIG. 6 is a showing of a mono-stable or "one shot" multivibrator, which is similar in its configuration to the circuit of FIGS. 2 and 3.

FIG. 6 shows a mono-stable or "1-shot" circuit which produces a single pulse having a predetermined duration following triggering, and which is similar to the circuit of FIG. 2. The circuit of FIG. 6 includes the two NOR gates 42-1 and 44-1, the transistor 64-1, the capacitor 50-2, and the current source 66-1. The phase-1 output is designated by the reference numeral 132 and the phase-2 output from NOR gate 44-1 is designated by the reference numeral 134. The trigger input to NOR gate 44-1 is designated by the reference numeral 136. Normally the phase-1 output 132 will be low and the phase-2 output 134 will be high, and the capacitor 50-2 will be discharged. When the trigger input at terminal 136 goes high, phase-2 at reference 134 will go to a "0," which allows the current source 66-1 to charge the capacitor C1, also designated by the reference 50-2. Once the voltage at point 138 reaches the threshold voltage of NOR gate 42-1, the output at terminal 132 will go low, and the output at terminal 134 representing phase-2 will go back to high, assuming that any trigger input has already gone low. This action will also quickly discharge the capacitor 50-2 through transistor 64-1 so that it will be ready for the next trigger input applied to terminal 136. With the threshold voltage of the NOR gate derived as shown hereinabove in FIG. 4, and with the current source 66-1 being derived in the same manner as shown hereinabove, then the time period of the pulse output of FIG. 6 will be insensitive to power supply variations, for the reasons discussed hereinabove.

In conclusion, it is to be understood that the foregoing detailed description and the accompanying drawings are illustrative of preferred embodiments of the invention. Other techniques may be employed to implement specific phases of the present invention. Thus, by way of example and not of limitation, the relaxation oscillator and other system components may have alternative logic configurations or circuit implementations, as long as the generalized principles for avoiding frequency variations with variations in the temperature and voltage level of the power supply, are followed. Accordingly, the present invention is not limited to that precisely as shown and described hereinabove.

What is claimed is:

1. A stabilized electronic circuit comprising:
   first and second NOR gates;
   means for coupling the output of each NOR gate to one input of the other NOR gate;

a capacitor having one terminal coupled to the other input of said first NOR gate;

means for coupling the other terminal of said capacitor to ground;

current source means coupled to said one terminal of said capacitor to charge up said capacitor;

transistor means for discharging said capacitor; and means for turning off said transistor means when said second NOR gate is triggered;

whereby said capacitor is charged from said current source to the trip voltage for said first NOR gate, which then returns the circuit to its original state.

2. A stable voltage controlled oscillator system which is relatively insensitive to variations in power supply voltage and temperature comprising:

a master voltage controlled oscillator (VCO);

means for connecting said master VCO into a phase lock loop, said phase lock loop including a source of regular constant frequency signals such as a clock, and means for generating a first control voltage for said master VCO to eliminate any differences between the output frequency of said master VCO and said regular constant frequency signals;

a slave VCO, said slave VCO including a pair of symmetrically connected cross-coupled logic circuits, means for turning one of said logic circuits on when the other is off, and vice versa, a first control circuit means for determining the threshold trip voltage for each of said logic circuits for said logic circuits to change from one state to the other; and a second control circuit means for determining the timing of the switching cycle of each of said logic circuits;

means for connecting one of said control circuits for said slave VCO to receive said first control voltage from said phase lock loop including said master VCO; and means for providing an additional reference voltage to the other of said control conduits of said slave VCO to determine the frequency thereof; and current mirror transistor circuit means for controlling the threshold trip points of said two logic circuits.

3. A stable VCO system as defined in claim 2 wherein said logic circuits are NOR gates.

4. A stable voltage controlled oscillator system which is relatively insensitive to variations in power supply voltage and temperature comprising:

a master voltage controlled oscillator (VCO);

means for connecting said master VCO into a phase lock loop, said phase lock loop including a source of regular constant frequency signals such as a clock, and means for generating a first control voltage for said master VCO to eliminate any differences between the output frequency of said master VCO and said regular constant frequency signals;

a slave VCO, said slave VCO including a pair of symmetrically connected cross-coupled logic circuits, means for turning one of said logic circuits on when the other is off, and vice versa, a first control circuit means for determining the threshold trip voltage for each of said logic circuits for said logic circuits to change from one state to the other; and a second control circuit means for determining the timing of the switching cycle of each of said logic circuits;

means for connecting one of said control circuits for said slave VCO to receive said first control voltage from said phase lock loop including said master VCO;

means for providing an additional reference voltage to the other of said control circuits of said slave VCO to determine the frequency thereof; and current mirror transistor circuit means for controlling the switching time cycle of said logic circuits.

5. A stable voltage controlled oscillator system which is relatively insensitive to variations in power supply voltage and temperature comprising:

a master voltage controlled oscillator (VCO);

means for connecting said master VCO into a phase lock loop, said phase lock loop including a source of regular constant frequency signals such as a clock, and means for generating a first control voltage for said master VCO to eliminate any differences between the output frequency of said master VCO and said regular constant frequency signals;

a slave VCO, said slave VCO including a pair of symmetrically connected cross-coupled logic circuits, means for turning one of said logic circuits on when the other is off, and vice versa, a first control circuit means for determining the threshold trip voltage for each of said logic circuits for said logic circuits to change from one state to the other; and a second control circuit means for determining the timing of the switching cycle of each of said logic circuits;

means for connecting one of said control circuits for said slave VCO to receive said first control voltage from said phase lock loop including said master VCO; and means for providing an additional reference voltage to the other of said control circuits of said slave VCO to determine the frequency thereof; and said slave VCO including first and second NOR gates; means for coupling the output of each NOR gate to one input of the other NOR gate; a capacitor coupled to the other input of said first NOR gate; a current source coupled to charge up said capacitor; transistor means for discharging said capacitor; and means for turning off said transistor means when said second NOR gate is triggered; whereby said capacitor is charged from said current source to the trip voltage for said first NOR gate which then returns the VCO to its original state.

6. A stable VCO system as defined in claim 5 wherein said means for providing an additional reference voltage includes a source of data signals and comparator circuit means for varying the additional reference voltage in accordance with differences between the slave VCO frequency and the incoming data rate.

7. A stable VCO system as defined in claim 5 wherein both said master VCO and said slave VCO are included on the same semi-conductor chip.

8. A stable VCO system as defined in claim 5 wherein said VCO's are implemented with metal oxide semiconductor field effect transistors.

9. A stable VCO system as defined in claim 5 including means for operating said slave VCO at substantially the same frequency as said master VCO.

10. A stabilized electronic circuit comprising:

first and second NOR gates;

means for coupling the output of each NOR gate to one input of the other NOR gate;

a capacitor coupled to the other input of said first NOR gate;

current source means coupled to charge up said capacitor;

transistor means for discharging said capacitor; and means for turning off said transistor means when said second NOR gate is triggered;

whereby said capacitor is charged from said current source to the trip voltage for said first NOR gate, which then returns the circuit to its original state; and a second capacitor coupled to the other input of said second NOR gate, an additional current source means coupled to charge up said second capacitor, and additional transistor means for discharging said second capacitor, whereby said electronic circuit oscillates with said first and second NOR gates alternately conducting and de-energized.

11. A stabilized electronic circuit as defined in claim 10 including means for grounding one terminal of each of said capacitors which is not coupled to the input of one of said NOR gates.

* * * * *